(12) United States Patent
Rudmann et al.

(10) Patent No.: US 10,431,571 B2
(45) Date of Patent: Oct. 1, 2019

(54) OPTO-ELECTRONIC MODULES, IN PARTICULAR FLASH MODULES, AND METHOD FOR MANUFACTURING THE SAME

(71) Applicant: ams Sensors Singapore Pte. Ltd., Singapore (SG)

(72) Inventors: Hartmut Rudmann, Jona (CH); Markus Rossi, Jona (CH); Renè Kromhof, Thalwil (CH)

(73) Assignee: ams Sensors Singapore Pte. Ltd., Singapore (SG)

( * ) Notice: Subject to any disclaimer, the term of this patent is extended or adjusted under 35 U.S.C. 154(b) by 530 days.

(21) Appl. No.: 14/367,352

(22) PCT Filed: Dec. 18, 2012

(86) PCT No.: PCT/EP2012/005223
§ 371 (c)(1),
(2) Date: Jun. 20, 2014

(87) PCT Pub. No.: WO2013/091829
PCT Pub. Date: Jun. 27, 2013

(65) Prior Publication Data
US 2014/0361200 A1     Dec. 11, 2014

Related U.S. Application Data

(60) Provisional application No. 61/579,293, filed on Dec. 22, 2011.

(51) Int. Cl.
*H01L 25/16* (2006.01)
*H01L 23/053* (2006.01)
(Continued)

(52) U.S. Cl.
CPC .......... *H01L 25/167* (2013.01); *H01L 23/053* (2013.01); *H01L 25/50* (2013.01);
(Continued)

(58) Field of Classification Search
CPC ..... H01L 25/167; H01L 23/053; H01L 25/50; H01L 24/73; H01L 33/58;
(Continued)

(56) References Cited

U.S. PATENT DOCUMENTS

| 5,912,872 | A | 6/1999 | Feldman et al. |
| 6,550,949 | B1 * | 4/2003 | Bauer ............... B60Q 1/0023 |
| | | | 362/545 |

(Continued)

FOREIGN PATENT DOCUMENTS

| CN | 1334485 A | 2/2002 |
| CN | 1629716 | 6/2005 |

(Continued)

OTHER PUBLICATIONS

Chinese Intellectual Property Office, search report in patent application No. 201280063999.3 (dated May 22, 2017) (1 page).

(Continued)

*Primary Examiner* — Georgia Y Epps
*Assistant Examiner* — Don Williams
(74) *Attorney, Agent, or Firm* — Michael Best & Friedrich LLP

(57) ABSTRACT

The opto-electronic module comprises a substrate member (P); at least one emission member (E1; E2) mounted on said substrate (P); at least one detecting member (D) mounted on said substrate (P); at least one optics member (O) comprising at least one passive optical component (L); at least one spacer member (S) arranged between said substrate member (P) and said optics member (O). The opto-electronic modules can be very small and can be produced in high quality (Continued)

in high volumes. In particular, at least two emission members (E1, E2), e.g., two LEDs, are provided, for emitting light of variable color. This can improve illumination of a scene.

20 Claims, 8 Drawing Sheets

(51) Int. Cl.
*H01L 25/00* (2006.01)
*H01L 33/58* (2010.01)
*H01L 23/00* (2006.01)

(52) U.S. Cl.
CPC .............. *H01L 24/73* (2013.01); *H01L 33/58* (2013.01); *H01L 2224/32225* (2013.01); *H01L 2224/48091* (2013.01); *H01L 2224/48227* (2013.01); *H01L 2224/73265* (2013.01); *H01L 2924/12044* (2013.01); *H01L 2924/3025* (2013.01)

(58) Field of Classification Search
CPC . H01L 2224/32225; H01L 2224/48091; H01L 224/48227; H01L 2224/73265; H01L 2924/12044; H01L 2924/3025
USPC .... 250/208.1, 205, 221, 222.1, 239; 345/32, 345/39, 42, 46, 48, 58, 63, 80–84
See application file for complete search history.

(56) References Cited

U.S. PATENT DOCUMENTS

| | | |
|---|---|---|
| 7,002,546 B1 | 2/2006 | Stuppi et al. |
| 7,309,855 B2 * | 12/2007 | Nagasaka ............... G01D 5/305 250/231.14 |
| 7,474,294 B2 * | 1/2009 | Leo ....................... G09G 3/3413 345/102 |
| 8,866,064 B2 * | 10/2014 | Yao .......................... G01V 8/20 250/221 |
| 2002/0181838 A1 | 12/2002 | Cunningham et al. |
| 2003/0020415 A1 | 1/2003 | Bruning |
| 2003/0059178 A1 * | 3/2003 | Kobayashi ............ G02B 6/4206 385/94 |
| 2004/0056916 A1 | 3/2004 | Arquilevich et al. |
| 2004/0201987 A1 | 10/2004 | Omata |
| 2004/0247232 A1 * | 12/2004 | Kathman ............. G02B 6/4201 385/14 |
| 2005/0134723 A1 | 6/2005 | Lee et al. |
| 2005/0184301 A1 | 8/2005 | Nagasaka et al. |
| 2006/0027828 A1 | 2/2006 | Kikuchi |
| 2006/0082679 A1 * | 4/2006 | Chua .................... H04N 5/2256 348/371 |
| 2006/0132777 A1 * | 6/2006 | Hubble, III ............... G01J 3/10 356/402 |
| 2007/0090282 A1 | 4/2007 | Chin et al. |
| 2008/0136955 A1 | 6/2008 | Kathman et al. |
| 2009/0323332 A1 | 12/2009 | Lo et al. |
| 2010/0258710 A1 | 10/2010 | Wiese et al. |
| 2010/0327164 A1 | 12/2010 | Costello et al. |
| 2011/0013292 A1 | 1/2011 | Rossi et al. |
| 2011/0031510 A1 | 2/2011 | Rossi et al. |
| 2011/0050979 A1 | 3/2011 | Rudmann |
| 2011/0057129 A1 | 3/2011 | Yao et al. |
| 2012/0008318 A1 | 1/2012 | Ishiwata et al. |
| 2012/0043552 A1 * | 2/2012 | David ................. C09K 11/0883 257/76 |
| 2014/0192527 A1 | 7/2014 | Dowling et al. |

FOREIGN PATENT DOCUMENTS

| | | |
|---|---|---|
| CN | 1677053 | 10/2005 |
| CN | 101543046 A | 9/2009 |
| EP | 2 017 890 | 6/2007 |
| EP | 2 659 282 | 7/2015 |
| JP | 2004327955 A | 11/2004 |
| JP | 2004537173 A | 12/2004 |
| JP | 2005204296 A | 7/2005 |
| JP | 2006114911 A | 4/2006 |
| JP | 2007036019 | 2/2007 |
| JP | 2010272527 A | 12/2010 |
| JP | 2011501351 A | 1/2011 |
| JP | 2011507219 A | 3/2011 |
| JP | 2011204397 A | 10/2011 |
| JP | 2011204659 A | 10/2011 |
| TW | 200937642 | 9/2009 |
| TW | 201000819 | 1/2010 |

OTHER PUBLICATIONS

Office Action issued in European Application No. 12816240.1, dated Feb. 7, 2019, 6 pages.

* cited by examiner

OPTO-ELECTRONIC MODULES, IN PARTICULAR FLASH MODULES, AND METHOD FOR MANUFACTURING THE SAME

TECHNICAL FIELD

The invention relates to the field of opto-electronics and more specifically to the packaging and manufacturing of opto-electronic components. More particularly, it relates to opto-electronic modules and to methods of manufacturing the same and to appliances and electronic devices comprising such modules, in particular wherein the modules are flash modules. In addition, a method for imaging a scene is provided. The invention relates to methods and apparatuses according to the opening clauses of the claims.

BACKGROUND OF THE INVENTION

From US 2010/0327164 A1, an opto-electronic module, more specifically a proximity sensor is known, during the manufacture of which light emitter dice and light detector dice are overmolded using transfer molding techniques so as to form lenses on these dice.

In U.S. Pat. No. 5,912,872, an integrated optical apparatus is presented. In the manufacture thereof, a support wafer having a plurality of active elements thereon is aligned with a transparent wafer having a corresponding plurality of optical elements. Such a support-transparent wafer pair may then be diced apart.

In US 2011/0050979 A1, an optical module for an electro-optical device with a functional element is disclosed. The optical module includes a lens substrate portion with at least one lens element, and a spacer. The spacer serves to keep the lens substrate at a well-defined axial distance from a base substrate portion of the fully assembled electro-optical device. In order to ensure an improved performance of the functional element, an EMC shield is provided. The spacer is at least in parts electrically conductive and thus forms the EMC shield or a part thereof. A method of manufacturing a plurality of such modules on a wafer scale is also disclosed in US 2011/0050979 A1.

DEFINITION OF TERMS

"Active optical component": A light sensing or a light emitting component. E.g., a photodiode, an image sensor, an LED, an OLED, a laser chip. An active optical component can be present as a bare die or in a package, i.e. as a packaged component.

"Passive optical component": An optical component redirecting light by refraction and/or diffraction and/or (internal and/or external) reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Lateral": cf. "Wafer"

"Vertical": cf. "Wafer" "Light": Most generally electromagnetic radiation; more particularly electromagnetic radiation of the infrared, visible or ultraviolet portion of the electromagnetic spectrum.

SUMMARY OF THE INVENTION

One object of the invention is to create particularly compact and/or useful opto-electronic modules. In addition, corresponding appliances comprising a multitude of such modules and electronic devices comprising at least one such module and methods for manufacturing such modules as well as methods for imaging a scene shall be provided.

Another object of the invention is to create an alternative way of manufacturing opto-electronic modules.

Another object of the invention is to create a particularly fast way of manufacturing opto-electronic modules and/or a particularly simple way of manufacturing opto-electronic modules.

Another object of the invention is to provide opto-electronic modules having a particularly accurate alignment and a corresponding manufacturing method.

Another object of the invention is to provide opto-electronic modules of particularly small dimensions.

Another object of the invention is to provide a reproducibly manufacturable opto-electronic module.

Another object of the invention is to provide opto-electronic modules being manufacturable in a particularly low number of manufacturing steps and a corresponding manufacturing method.

Another object of the invention is to provide a method for manufacturing opto-electronic modules involving an improved handling, in particular a simplified handling.

Another object of the invention is to provide particularly small and/or light-weight photographic devices.

Another object of the invention is to make possible to provide a particularly good illumination of a scene to be recorded, in particular enabling to do so using a particularly small electronic device.

Another object of the invention is to provide particularly small electronic devices comprising at least one opto-electronic module.

Further objects emerge from the description and embodiments below.

At least one of these objects is at least partially achieved by apparatuses, appliances and methods according to the patent claims.

The opto-electronic module comprises
a substrate member;
at least one emission member mounted on said substrate;
at least one detecting member mounted on said substrate;

at least one optics member comprising at least one passive optical component;

at least one spacer member arranged between said substrate member and said optics member.

The emission member is provided for emitting light, in particular flashes of light. The detecting member is provided for detection of light, in particular for determining at least one color-related property of light. But it can also, in certain embodiments, be provided for detecting or determining a property indicative of an overall light intensity and/or of a spatial or angular light intensity distribution. One task of said spacer member is to provide a well-defined (vertical) distance between said at least one passive optical component on the one side and the at least one emission member and the at least one detecting member on the other side.

In one embodiment, said optics member comprises at least one non-transparent portion and at least one transparent portion comprising said at least one passive optical component. In particular, it can be provided that said non-transparent portion encompasses at least one of said at least one transparent portions, and more particularly, it can be provided that said non-transparent portion encompasses each of said at least one transparent portions.

In one embodiment which may be combined with the before-addressed embodiment, said spacer member substantially is made of a non-transparent material. This can prevent undesired entry of light into the opto-electronic module. Said non-transparent material can substantially attenuate or block light.

In one embodiment which may be combined with one or more of the before-addressed embodiments, said substrate member is substantially a printed circuit board. Said substrate member can in particular predominantly consist of a printed circuit board base material, e.g., FR4 material. The substrate member can be non-transparent, and it can provide electrical contacts from said emission member and from said detecting member to the outside of the opto-electronic module. One can thus readily provide that said substrate provides at least one electrical connection from said at least one detection member across said substrate and at least one electrical connection from said at least one emission member across said substrate.

In one embodiment which may be combined with one or more of the before-addressed embodiments, said substrate member is substantially block-shaped or plate-shaped.

In one embodiment which may be combined with one or more of the before-addressed embodiments, said optics member is, at least when disregarding said at least one passive optical component, substantially block-shaped or plate-shaped.

In particular, in can be provided that said substrate member and said optics member are arranged generally parallel to each other.

These embodiments can contribute to a particularly good manufacturability of the opto-electronic module.

In one embodiment which may be combined with one or more of the before-addressed embodiments, outer lateral dimensions of
   said substrate; and
   said spacer member;
are substantially identical, and in particular it can be provided that outer lateral dimensions of
   said substrate;
   said optics member; and
   said spacer member;
are substantially identical.

Also these embodiments can contribute to a particularly good manufacturability of the opto-electronic module.

In one embodiment which may be combined with one or more of the before-addressed embodiments, said detecting member is encompassed by said separating member, and wherein said emission member is encompassed by said separating member. This can suppress undesired entry of light into or exit of light out of the opto-electronic module.

In one embodiment which may be combined with one or more of the before-addressed embodiments, said module comprises a housing, in particular wherein said substrate member, said spacer member and said optics member contribute to said housing. This way, a good manufacturability can be achievable, and particularly small opto-electronic modules can be manufactured.

In one embodiment which may be combined with one or more of the before-addressed embodiments, said spacer member is at least one of made of a hardened hardenable material and obtained using a replication process, in particular embossing. This can make possible a mass production allowing various designs of spacer members while achieving a high precision (in vertical as well as in lateral directions).

In one embodiment which may be combined with one or more of the before-addressed embodiments, said at least one passive optical component comprises at least one optical structure, in particular wherein said at least one optical structure is at least one of made of a hardened hardenable material and obtained using a replication process, in particular embossing. This can make possible a mass production allowing various designs of the optical structures while achieving a high precision (in vertical as well as in lateral directions).

In one embodiment which may be combined with one or more of the before-addressed embodiments, said at least one passive optical component comprises at least one lens element, in particular at least one diffractive lens element. In various applications, lenses can provide advantages, e.g., in flash modules for emitting light flashes. Diffractive lenses can, at least with respect to the vertical direction, be particularly space-saving, thus making particularly small module designs possible.

In one embodiment which may be combined with one or more of the before-addressed embodiments, said at least one passive optical component comprises a first lens, said first lens and said at least one emission member and said at least one detecting member being arranged such that light emitted from said at least one emission member traverses substantially in full or at least predominantly said first lens and that light from outside the opto-electronic module impinging on said at least one detecting member traverses substantially in full or at least predominantly said first lens. This way, a single lens can simultaneously fulfill two tasks.

In one embodiment which may be combined with one or more of the before-addressed embodiments, but usually with the exception of the last-addressed embodiment, said at least one passive optical component comprises a first lens and a second lens, said first lens and said at least one emission member being arranged such that light emitted from said at least one emission member traverses substantially in full or at least predominantly said first lens, and said second lens and said at least one detecting member being arranged such that light from outside the opto-electronic module impinging on said at least one detecting member traverses substantially in full or at least predominantly said second lens. This way, said first lens and said second lens can each be designed to fulfill their respective tasks. It is also possible to provide, e.g., one lens per emission member and/or one lens per detecting member.

In one embodiment which may be combined with one or more of the before-addressed embodiments, said spacer member comprises a portion arranged between said at least one detecting member and said at least one emission member, in particular wherein said portion separates said opto-electronic module into a first and a second compartments, said first compartment containing said at least one emission member, said second compartment containing said at least one detecting member. This can prevent or reduce an illumination of said detecting member with light emitted from said emission member.

In one embodiment which may be combined with one or more of the before-addressed embodiments, said at least one emission member is at least one flash light source, in particular at least one flash LED. Flash lights are widely used in modern small-size electronic devices, where mass production and extremely small form factor are important. However, the emission member may also be operable or operated for emitting continuous light. The at least one emission member may comprise, e.g., an LED. As to the light emittable or emitted by the at least one emission member, in particular visible light may be of interest, but (alternatively or additionally) also infrared light may be of particular interest, e.g., for photographing or filming low-light scenes.

In one embodiment which may be combined with one or more of the before-addressed embodiments, the opto-electronic module comprises at least two emission members. These two can be nominally different ones or can be nominally equal, in particular with respect to their respective specifications. In particular, at least a first and a second of said at least two emission members have spectrally different light emission characteristics. This can be of advantage when it is desirable to be able to illuminate different scenes, in particular for illuminating scenes with light of a selectable color temperature or hue. It can, e.g., be provided that a first one of the at least two emission members is structured and configured for emitting light comprising a higher portion of light of the blue spectral range and/or a smaller portion of light of the yellow spectral range than a second one of these at least two emission members. It can additionally or alternatively be provided that at least a first and a second of said at least two emission members have spectral emission characteristics allowing to create or mimic an emission of white light of varying color temperature by varying a relative emission intensity of these two emission members. E.g., it can be provided that a first one of the emission members emits substantially white light of a lower color temperature than a second one. Of course, one can also provide not only two, but three or even four or five emission members, a portion of them or all of them emitting light of a different spectral composition, and in particular allowing to emit light of adjustable hue or color temperature, wherein this can in particular be accomplished by varying relative intensities of light emitted by the respective emission members.

In one embodiment referring to the last-addressed embodiment, the opto-electronic module is structured and configured such that a light intensity distribution (in particular an angular light intensity distribution) of light emitted by a first of said emission members through said one lens leaving the opto-electronic module is different from a light intensity distribution of light emitted by a second of said emission members through said other lens leaving the opto-electronic module. This can be useful, e.g., when different lenses or a zoom lens is present in a device (such as a camera) in which the opto-electronic module is used, and may be accomplished in various ways. E.g., the arrangement of said at least two emission members relative to the at least one passive optical component may be selected accordingly, namely different for at least two of the emission members; and/or at least two of the emission members are designed (or structured and configured) for emitting light with (substantially) different light intensity distributions; and/or a redirecting or beam forming accomplished by the at least one passive optical component is different for light emitted by said first and for light emitted by said second emission member. The embodiment may make possible to provide an illumination (of a scene) provided by the at least two emission members which can be varied or selected, namely in particular by varying or selecting the intensity ratio of light emitted by said first and second emitting members, respectively.

In one embodiment referring to one or both of the two last-addressed embodiments (the opto-electronic module comprising at least two emission members), said at least one passive optical component comprises one lens assigned to a first of said at least two emission members and another lens assigned to a second of said at least two emission members, and said one lens and said first emission member are arranged such that light emitted from said first emission member traverses substantially in full or at least predominantly said one lens, and said other lens and said second emission member are arranged such that light emitted from said second emission member traverses substantially in full or at least predominantly said other lens. In particular, it may be provided that a light intensity distribution of light emitted by said first emission member through said one lens leaving the opto-electronic module is different from a light intensity distribution of light emitted by said second emission member through said other lens leaving the opto-electronic module. It is furthermore possible to provide that said one lens and said other lens are embodied as two different portions of one lens.

In one embodiment which may be combined with one or more of the before-addressed embodiments, said at least one detecting member is color-sensitive, more particularly wherein said at least one detecting member is structured and configured for outputting signals indicative of a color-content of light impinging thereon. Additionally or alternatively, it can be provided that said at least one detecting member additionally or merely allows to differentiate light intensities and in particular outputs a signal dependent on the amount of light impinging thereon.

In one embodiment which may be combined with one or more of the before-addressed embodiments, said at least one detecting member comprises an image sensor, in particular a color image sensor.

In one embodiment which may be combined with one or more of the before-addressed embodiments, said module comprises at least two detecting members, in particular wherein at least two of said detecting members have spectrally different sensitivities.

Said at least two detecting members can be, e.g., at least two photodiodes. E.g., spectrally different filters can be provided at the detecting members which filter (in a spectrally different manner light detected by the detecting members.

In one embodiment which may be combined with one or more of the before-addressed embodiments, at least one of
 said at least one detecting member; and said at least one emission member;
is provided as a chip-scale package or as a bare die, in particular wherein all said detecting members and emission members are provided as bare dice or as chip-scale packages. The opto-electronic module makes it possible to have mounted therein unpackaged chips which again allows particularly small module designs.

In one embodiment which may be combined with one or more of the before-addressed embodiments, the module comprises a baffle portion. Such a baffle portion usually is arranged on that side of said optics member which is opposite to that side of the optics wafer on which said spacer member is arranged. Such a baffle member usually has an opening through which light can pass which then also passes said at least one passive optical component and/or which in advance had passed said at least one passive optical component. Such a baffle member can be or provide a mechanical stop for mounting or attaching the module in a well-defined manner.

In one embodiment which may be combined with one or more of the before-addressed embodiments, the module comprises a light guide element, in particular wherein said light guide element is arranged on a side of said optics member which faces away from said spacer member. The light guide member can be integrally formed with at least a part or portion of said optics member or be a part distinct from said optics member. The optics member can in particular comprise one or more mechanical guiding elements, e.g., one or more protrusions and/or one or more recesses and/or one or more edges. The light guiding element can, e.g., be of substantially prismatic shape, e.g., of substantially cylindrical shape.

In the U.S. provisional patent application with Ser. No. 61/543,490, filed on Oct. 5, 2011 with the title "MICRO-OPTICAL SYSTEM AND METHOD OF MANUFACTURE THEREOF", opto-electronic modules are described which comprise light guide elements, as well as methods for manufacturing these. The properties of the modules and its components and the ways of manufacturing them can be readily applied to modules disclosed in the present patent application. Therefore, said US provisional patent application with Ser. No. 61/543,490 is herewith incorporated by reference in the present patent application. Therein, it is to be noted (and in fact already clear from comparing the Figures) that what is referred to as "base plate" in said US provisional patent application with Ser. No. 61/543,490 corresponds to a portion of said optics member.

The appliance according to the invention comprises a substrate wafer, an optics wafer, a spacer wafer, wherein the multitude of substrates is comprised in said substrate wafer, the multitude of optics members is comprised in said optics wafer, and the multitude of spacer members is comprised in said spacer wafer, in particular wherein said appliance is a wafer stack.

Such an appliance is very useful when manufacturing opto-electronic modules of the described kind in a high number.

The electronic device according to the invention comprises at least one opto-electronic module according to the invention and, in particular, a processing unit operationally connected to said at least one emission member and to said at least one detecting member. It is possible to provide that said electronic device comprises an electronic circuit to which said at least one opto-electronic module is operationally connected, more particularly wherein said electronic circuit is implemented using a printed circuit board, said opto-electronic module being mounted on said printed circuit board.

In one embodiment of said electronic device comprising said processing unit, said processing unit is structured and configured for receiving signals from said detecting member and for controlling said emission member in dependence of said signals. Said processing unit can thus comprise (or be) a controller. This can make it possible, to illuminate a scene in way dependent on the scene and/or on the light present in the scene, in particular to adjust a color temperature of an emitted flash (usually composed of at least two at least substantially simultaneously emitted flashes emitted by two or more emission members) to light present in the scene, in particular to a color temperature prevailingly present in the scene. Alternatively or additionally, e.g., a spatial and/or angular light intensity distribution of emitted light may be realized (e.g., controlled by said processing unit or controller), e.g., by varying the intensities (or relative intensities) of different ones of emission members of the electronic device (and more particularly of the opto-electronic module).

A subsequent emission of light by two or more emission members is also possible, but usually, two or more flashes will be emitted within one exposure time, and it is also possible that two or more differently illuminated exposures are subsequently taken, each illuminated by a flash of different properties.

In one embodiment of the electronic device which may be combined with the before-addressed embodiment, the device is at least one of
  a hand-held device;
  communication device, in particular a hand-held communication device;
  a photographic device, in particular a photo camera or a video camera.

The method for manufacturing an opto-electronic module comprises the steps of
  a) providing a substrate wafer on which a multitude of detecting members and a multitude of emission members are arranged;
  b) providing a spacer wafer;
  c) providing an optics wafer, said optics wafer comprising a multitude of passive optical components, in particular wherein said passive optical components are lens elements;
  d) preparing a wafer stack in which said spacer wafer is arranged between said substrate wafer and said optics wafer, in particular such that said detecting members and said emission members are arranged between said substrate wafer and said optics wafer.

In one embodiment of the method, step a) comprises the step of
  a1) placing said detecting members and said emission members on said substrate wafer by pick-and-place.

In one embodiment of the method, which may be combined with the before-addressed embodiment, the method comprises the step of
  c1) manufacturing said passive optical components by means of replication, in particular using embossing.

This can make a high-precision mass production of the passive optical components possible.

In one embodiment of the method, which may be combined with one or more of the before-addressed embodiments, said spacer wafer is made of a material which substantially attenuates or blocks light. This can contribute to simplifying the manufacture.

In one embodiment of the method, which may be combined with one or more of the before-addressed embodiments, each of said multitude of passive optical components is associated with at least one of said emission members and/or with at least one of said detecting members.

In one embodiment of the method, which may be combined with one or more of the before-addressed embodiments, the method comprises the step of h) obtaining said spacer wafer by means of a replication process, in particular using embossing.

In one embodiment of the method, which may be combined with one or more of the before-addressed embodiments, the method comprises the step of e) providing said substrate wafer with solder balls on that side of the substrate sensor which is opposed to that side of the substrate member on which said detecting members are arranged.

In one embodiment of the method, which may be combined with one or more of the before-addressed embodiments, the method further comprises the step of f) separating said wafer stack into a multitude of separate modules each comprising
  a portion of said substrate wafer;
  at least one of said detecting members;
  at least one of said emission members;
  a portion of said spacer wafer.

In one embodiment of the method, which may be combined with one or more of the before-addressed embodiments, the method further comprises the step of g) providing a baffle wafer arranged next to said optics wafer on that side of said optics wafer which is opposed to that side of said optics wafer on which said spacer wafer is arranged;

in particular wherein furthermore step d) is replaced by the step of d') preparing a wafer stack in which said spacer wafer is arranged between said substrate wafer and said optics wafer, in particular such that said detecting members are arranged between said substrate wafer and said optics wafer, and wherein said optics wafer is arranged between said baffle wafer and said spacer wafer.

In one embodiment of the method, which may be combined with one or more of the before-addressed embodiments, said substrate wafer and said multitude of detecting members and said multitude of emission members substantially form a printed circuit board assembly.

The method for imaging a scene comprises the steps of
  using an opto-electronic module according to the invention;
  obtaining from said at least one detecting member a signal related to light emitted from said scene;
  controlling said at least one emission member such that said at least one emission member emits light during an exposure, said emitted light depending on said signal, in particular a spectral composition and/or an intensity distribution of said emitted light depending on said signal.

In one embodiment of this method, said at least one detecting member is color-sensitive. In particular it is structured and configured for outputting signals dependent on a color-content of said scene. This way, said at least one emission member can be controlled so as to emit light having a spectral composition depending on said signal. A provision of at least two emission members can, in this context, be particularly advantageous. It is additionally or alternatively possible to provide that by means of said at least one detecting member, a brightness of scene is estimated in advance to and/or during recording an image of said scene. Furthermore, it is additionally or alternatively possible to provide that by means of said at least one detecting member, a light intensity and/or a color (in particular a color temperature and/or a color distribution and/or a light intensity distribution across said scene) is estimated. This can be accomplished, e.g., while emitting light, in particular light flashes, prior to recording the scene (pre-microbursts).

It is readily understood that features mentioned with respect to a certain portion of the invention, e.g., for a method or for a module, can be provided—at least in analogy and as far as logically meaningful—in other portions of the invention, e.g., in an electronic device or appliance. The achievable effects correspond to each other.

Further embodiments and advantages emerge from the dependent claims and the figures.

BRIEF DESCRIPTION OF THE DRAWINGS

Below, the invention is described in more detail by means of examples and the included drawings. The figures show schematically.

The described embodiments are meant as examples and shall not confine the invention.

DETAILED DESCRIPTION OF THE INVENTION

Figure 1:
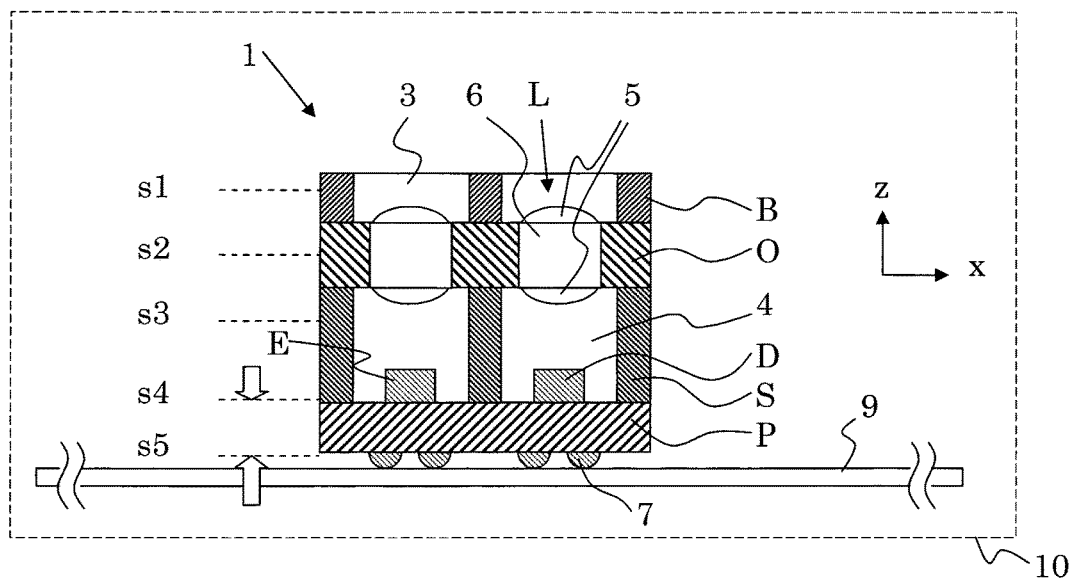
FIG. 1 a cross-sectional view of an opto-electronic module.
Figure 2:
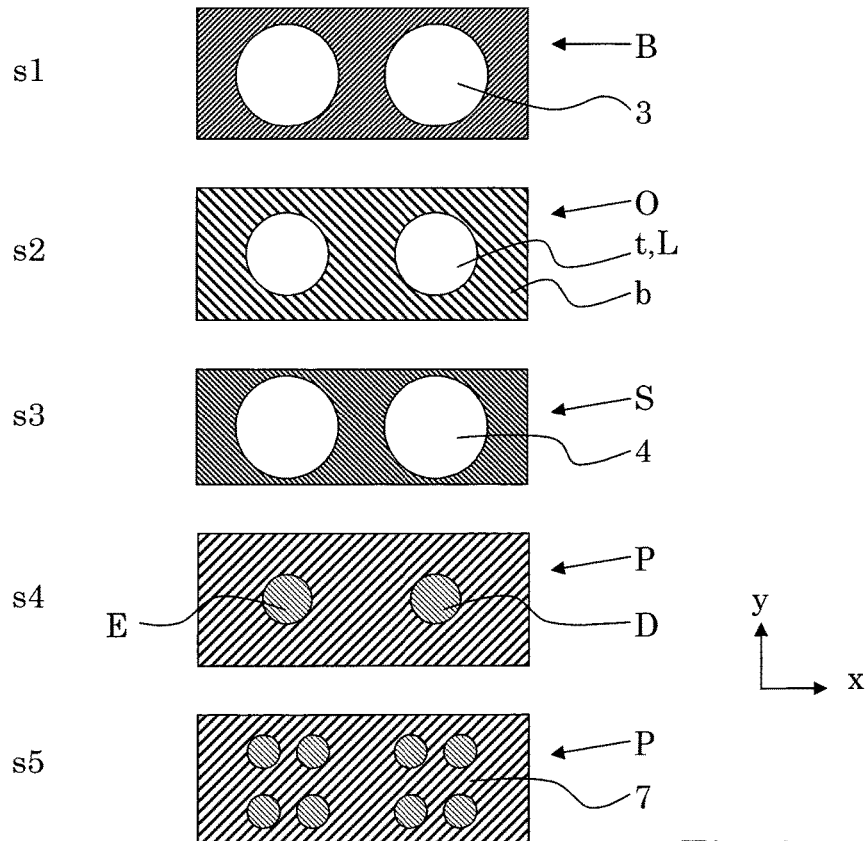
FIG. 2 various cross-sectional views of constituents of the module of FIG. 1.

FIG. 1 shows a schematic cross-sectional view of an opto-electronic module 1. The illustrated cross-section is a vertical cross-section. FIG. 2 shows various lateral schematic cross-sectional views of constituents of the module of FIG. 1, wherein the approximate positions of these lateral cross-sections are indicated in FIG. 1 by s1 to s5 and dashed lines. For s4 and s5, the direction of view is indicated by arrows.

Module 1 comprises several constituents (P, S, O, B) stacked upon each other in a direction through which the term "vertical" is defined; it corresponds to the z direction (cf. FIG. 1). Directions in the x-y plane (cf. FIG. 2) perpendicular to the vertical (z) direction are referred to as "lateral".

Module 1 comprises a substrate member P, a spacer member S, an optics member O and an optional baffle member B stacked upon each other. Substrate member P is, e.g., a printed circuit board (PCB). The printed circuit board can more specifically also be referred to as an interposer. On the PCB, an emission member E for emitting light, in particular white light, can be mounted, e.g., a light-emitting diode; and a detecting member D can be mounted thereon, for detecting light, in particular visible light, e.g., a photo diode or an image sensor. Electrical contacts of emission member E and detecting member D are electrically connected to the outside of module 1, where solder balls 7 are attached. Instead of providing solder balls 7, it would also be possible to provide contact pads on the PCB which are not (or at a later time) provided with solder balls.

This way, module 1 can be mounted on a printed circuit board 9, e.g., in surface mount technology (SMT), next to other electronic components (not shown) such as a controller controlling emission member E in dependence of signals outputted by detecting member D. Printed circuit board 9 may be a constituent of an electronic device 10 such as a hand-held communication device or a photographic device, e.g., a photo camera. In particular, device 10 can be a smart phone. Module 1 is particularly suitable for such an application because it can be manufactured having a particularly small size.

Spacer member S has two openings 4, emission member E arranged in one of them and detecting member D being arranged in the other. This way, emission member E and detecting member D are laterally encircled by separating member S.

Spacer member S may fulfill several tasks. It can ensure a well-defined distance between substrate member P and optics member O (through its vertical extension) which helps to achieve well-defined light paths from emitting member E through optics member O and from the outside of module 1 through optics member O onto detecting member D. Spacer member S can also provide protection of detecting member D from light that is not supposed to be detected by detection member D, by being substantially non-transparent to light generally detectable by detecting member D and by forming a portion of the outside walls of module 1. And, spacer member S can also provide protection of detecting member D from light emitted by emitting member E which should not reach detecting member D, so as to reduce optical cross-talk between emission member E and detecting member E, by being substantially non-transparent to light generally detectable by detecting member D and by forming a wall between emission member E and detecting member D. Light reflected inside module 1 and stray light originating from emission member E can this way be kept from reaching detecting member D. Typically, separating member S is made of a polymer material, in particular of a hardenable or more specifically curable polymer material, e.g., of an epoxy resin.

Optics member O comprises a blocking portion b and two transparent portions t, one for allowing light emitted by emission member E to leave module 1, and another one for allowing light to enter module 1 from the outside of module 1 and reach detecting member D.

Blocking portion b is substantially non-transparent for light generally detectable by detecting member D, e.g., by being made of a suitable (polymer) material. Transparent portions t comprise a passive optical component L or, more particularly and as an example, a lens member L each, for light guidance or beam forming. Passive optical components L may, e.g., comprise, as shown in FIG. 1, two lens elements 5 in close contact to a transparent element 6. Transparent elements 6 can have the same vertical dimension as optics member O where it forms blocking portion b, such that optics member O where it forms blocking portion b together with transparent elements 6 describes a (close-to-perfect) solid plate shape. Lens elements 5 redirect light by refraction (cf. FIG. 1) and/or by diffraction. E.g., they may all be of generally convex shape (as shown in FIG. 1), but one or more of lens elements 5 may be differently shaped, e.g., generally or partially concave. Diffractive lens elements can be particularly space-saving in the vertical direction.

Baffle member B allows to shield undesired light, in particular light leaving module 1 or incident to module 1 in an desired angle. As illustrated in FIGS. 1 and 2, baffle member B may have two separate transparent regions 3 which may be embodied as openings or by means of transparent material. Baffle member B can, outside the transparent regions 3, be made of a material substantially attenuating or blocking light generally detectable by said detecting members, or it could be provided with a coating having such a property, wherein the latter will usually be more complex to manufacture. The shape of baffle member B or more precisely of the transparent regions 3, can, of course, be different from what is shown in FIGS. 1 and 2, e.g., describe cone-like shapes or describe a truncated pyramid. Baffle member B, in addition, can provide a mechanical stop when mounting module 1.

The lateral shape not only of the transparent regions 3, but also of the transparent portions t and of the openings 4 do not have to be circular, but may have other appearances, e.g., polygonal or rectangular with rounded corners.

Module 1 is an opto-electronic component, more precisely a packaged opto-electronic component. The vertical side walls of module 1 are formed by items P, S, O and B. A bottom wall is formed by substrate member P, and a top wall by baffle member B or by baffle member B together with optics member O.

As is well visible in FIG. 2, the four items P, S, O, B, which can for the reasons named above also be referred to as housing components, all have substantially the same lateral shape and lateral dimensions. This is related to a possible and very efficient way of manufacturing such modules 1 which is described in more detail below referring to FIGS. 3 and 4. These housing components P, S, O, and B are all of generally block- or plate-like shape or more generally of generally rectangular parallelepiped shape, possibly having holes or openings (such as baffle member B and spacer member S do) or projections (such as optics member O does).

The module 1 shown in FIG. 1 (and also other opto-electronic modules described herein) can be a flash module, more particularly a flash module with an incorporated light sensor. Such a module 1 could facilitate to determine—by means of detecting member D—an amount of light present outside the module 1, in particular an amount of light present in a scene such as a scene to be recorded, and to provide an amount of light—by means of emission member E—depending on said determined amount light present outside the module 1, and in particular to provide an illumination of a scene to be recorded, said illumination depending on said amount of light present in said scene.

Furthermore, it is possible to provide modules which are designed according to the same principles as discussed above, but comprising, in addition to detecting member D and emission member E, one or more additional electronic components such as one or more additional light detectors, or one or more integrated circuits, or one or more light sources.

Further refinements are in particular possible when at least one additional emission member and/or an additional detection member is present in the module 1 (not shown in FIG. 1), as will become clear from the description below.

The active electronic components comprised in a module (such as emission member E and detecting member D in the example of FIG. 1) can be packaged or unpackaged electronic components. For contacting substrate member P, technologies such as wire-bonding or flip chip technology or any other known surface mount technologies may be used, or even conventional through-hole technology. Unpackaged components (bare dice) make it possible to design particularly small modules 1, which applies to chip-scale packages, too.

Figure 3:
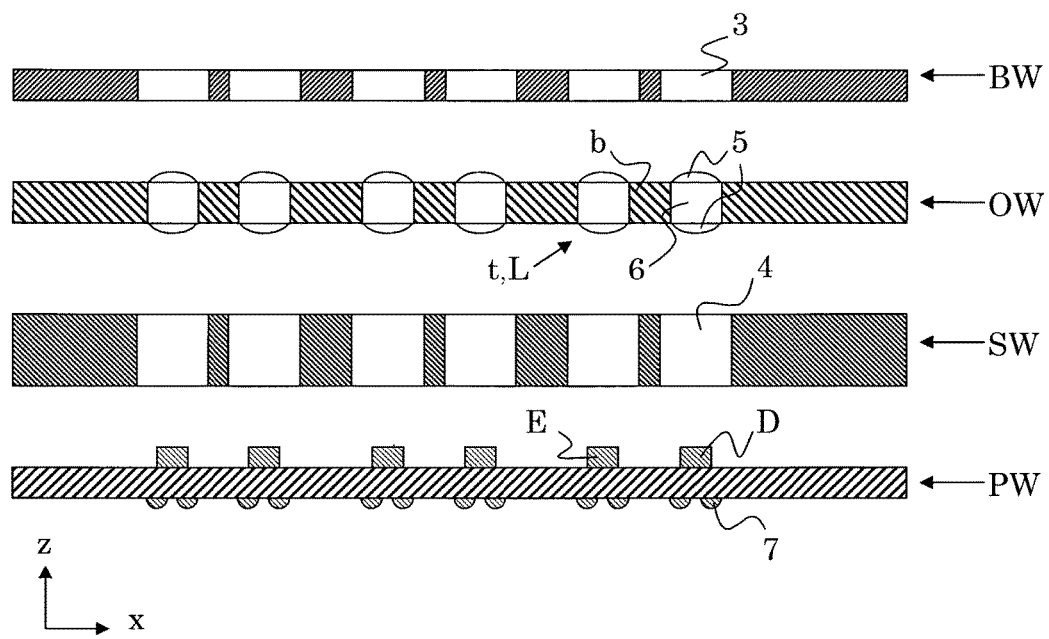
FIG. 3 a cross-sectional view of wafers for forming a wafer stack for manufacturing a multitude of modules of FIG. 1.

FIG. 3 shows a schematical cross-sectional view of wafers for forming a wafer stack (a wafer stack also sometimes referred to as an appliance in the present patent application) for manufacturing a multitude of modules as shown in FIG. 1. It is possible to manufacture such modules 1 (practically) completely on wafer-scale, of course with a subsequent separation step. Although FIGS. 3 and 4 only show provisions for three modules 1, there will usually be in one wafer stack provisions for at least 10, rather at least 30 or even more than 50 modules in each lateral direction. Typical dimensions of each of the wafers are: laterally at least 5 cm or 10 cm, and up to 30 cm or 40 cm or even 50 cm; and vertically (measured with no components arranged on substrate wafer PW) at least 0.2 mm or 0.4 mm or even 1 mm, and up to 6 mm or 10 mm or even 20 mm.

Four wafers are sufficient for manufacturing a multitude of modules as shown in FIG. 1: A substrate wafer PW, a spacer wafer SW, an optics wafer OW and a baffle wafer BW. Each wafer comprises a multitude of the corresponding members comprised in the corresponding module 1 (cf. FIGS. 1 and 2), usually arranged on a rectangular lattice, typically with a little distance from each other for a wafer separation step.

Substrate wafer PW can be a PCB of standard PCB materials, provided with solder balls 7 on the one side and with active optical components (E and D) soldered or glued to the other side. The latter can be placed on substrate wafer PW by pick-and-place using standard pick-and-place machines.

In order to provide maximum protection from detecting undesired light, all wafers PW, SW, OW, BW can substantially be made of a material substantially non-transparent for light generally detectable by detecting members D, of course except for transparent areas such as transparent portions t and transparent regions 3.

Wafers SW and BW and possibly also all or a portion of wafer OW can be produced by replication. In an exemplary replication process, a structured surface is embossed into a liquid, viscous or plastically deformable material, then the material is hardened, e.g., by curing using ultraviolet radiation and/or heating, and then the structured surface is removed. Thus, a replica (which in this case is an negative replica) of the structured surface is obtained. Suitable materials for replication are, e.g., hardenable (more particularly curable) polymer materials or other replication materials, i.e. materials which are transformable in a hardening step (more particularly in a curing step) from a liquid, viscous or plastically deformable state into a solid state. Replication is a known technique, cf., e.g., WO 2005/083789 A2 for more details about this.

In case of optics wafer OW, replication or molding may be used for obtaining the non-transparent portions (blocking portions b). It would also be possible to provide holes, where transparent portions t are supposed to be, by drilling or by etching.

Subsequently, a so-obtained precursor wafer is provided with passive optical components L, so as to yield optics wafer OW. This may be accomplished by means of replication, e.g., forming passive optical components L as a unitary parts, e.g., as described in US 2011/0043923 A1. The passive optical components L can, however, also be manufactured starting from a semi-finished part being a wafer comprising transparent elements 6 within holes by which transparent regions 3 are defined. This can be particularly useful when the passive optical components L each describe at least one apex, and those apices are located outside a vertical cross-section of the optics wafer OW without lens members. Such a semi-finished part is (usually and in the exemplary case shown in the figures) a flat disk-like wafer having no holes penetrating the wafer in the transparent regions 3 and having virtually no or only shallow surface corrugations, such surface corrugations usually being concave, i.e. not extending beyond the wafer surface as described by the blocking portions b.

A semi-finished part like that can be obtained starting from a flat precursor wafer (typically made of one material) having holes or openings where the transparent portions are supposed to be and then filling the holes with transparent material, e.g., using a dispensing process, and either filling the holes in the precursor wafer one-by-one, e.g., using a dispenser such as used for underfilling processes in flip-chip technology or the like, or by filling several holes at once, e.g., using a squeegee process (e.g. as known from screen printing) or a dispenser with several hollow needles outputting material. During the dispensing, the wafer can be placed on a flat support plate, e.g., made of a silicone. Care has to be taken in order to prevent the formation of air bubbles or cavities in the dispensed material, since this would degrade the optical properties of the passive optical components L to be produced. E.g., one can carry out the dispensing in such a way that wetting of the wafer material starts at an edge formed by the wafer and an underlying support plate (or in a place close to such an edge), e.g., by suitably guiding a hollow needle outputting the material close to such an edge. Subsequently, the dispensed material is cured, e.g., by heat or UV radiation, so as to obtain hardened transparent material.

Convex meniscuses possibly formed this way can be flattened by polishing, so as to obtain a transparent element 6 having parallel surfaces adjusted to the wafer thickness. Then, by means of replication, optical structures 5 (e.g., lens elements) are applied to typically both sides (top and bottom side) of wafer OW. Application to only one side, in particular to the bottom side, is also possible. In case of concave meniscuses of the transparent elements, the replication can take place on these, wherein the amount of applied replication material might have to be adjusted accordingly.

More details concerning the above-described semi-finished parts and optics wafers comprising such semi-finished parts as well as their respective manufacture can be found in the US provisional application with Ser. No. 61/509,357 filed on Jul. 19, 2011 with the title "METHOD FOR MANUFACTURING PASSIVE OPTICAL COMPONENTS, AND DEVICES COMPRISING THE SAME" which is herewith incorporated by reference in the present patent application.

As has already been mentioned before, it is generally possible to provide that said spacer wafer SW and/or said baffle wafer BW are obsolete in the sense that a particular kind of optics wafer is provided. Namely an optics wafer ("combined optics wafer") which incorporates the features and functionalities of said spacer wafer SW and/or said baffle wafer BW. Producing such a "combined optics wafer" may be accomplished using a particular precursor wafer and, manufactured based thereon, a particular semi-finished part. Such a precursor wafer and semi-finished part, respectively, has at least one structured surface, usually having protrusions extending vertically beyond at least one of the two surfaces of transparent elements to be provided in the precursor wafer and present in the semi-finished part, respectively. Looking upon wafers OW and SW (or wafers OW and BW, or wafers OW and SW and BW) in FIG. 4 as one single part it can be readily visualized what a corresponding optics wafer ("combined optics wafer") for manufacturing a module according to FIG. 1 and also a corresponding semi-finished part would look like.

Also for the reason of providing additional information and details concerning the above-described "combined spacer wafers", the before-mentioned US provisional application with Ser. No. 61/509,357 filed on Jul. 19, 2011 with the title "METHOD FOR MANUFACTURING PASSIVE OPTICAL COMPONENTS, AND DEVICES COMPRISING THE SAME" is herewith incorporated by reference in the present patent application.

In order to form a wafer stack 2, the wafers are aligned and bonded together, e.g., by gluing, e.g., using a heat-curable epoxy resin. It is usually a critical point to ensure that each active optical component (such as detecting members D and emission members E on the substrate wafer PW) is sufficiently accurately allocated with a corresponding passive optical component (such as passive optical components L of the optics wafer OW).

Figure 4:
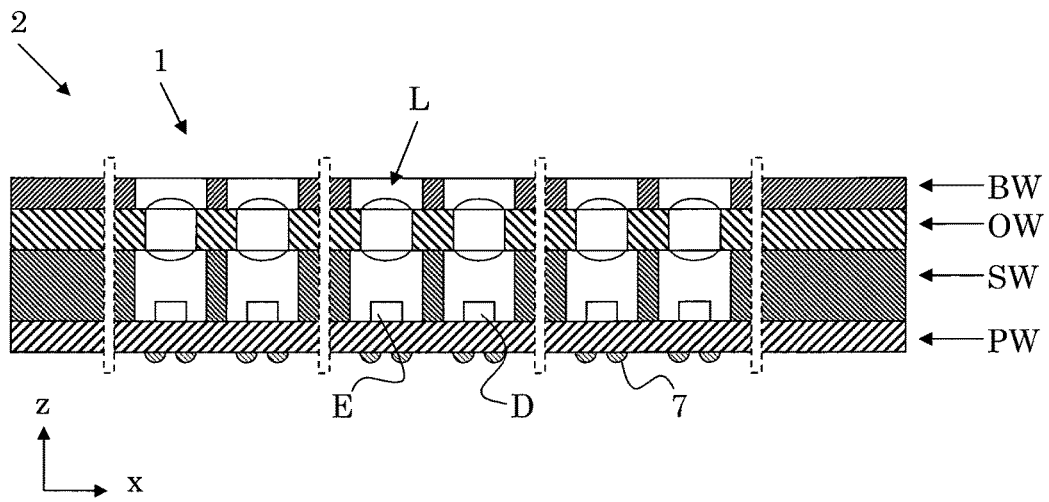
FIG. 4 a cross-sectional view of a wafer stack for manufacturing a multitude of modules of FIG. 1.

FIG. 4 shows a cross-sectional view of a so-obtained wafer stack 2 for manufacturing a multitude of modules 1 as shown in FIG. 1. The thin dashed rectangles indicate where separation takes place, e.g., by means of using a dicing saw or by laser cutting.

The fact that most alignment steps are carried out on wafer level makes it possible to achieve a good alignment (in particular of members D and E with respect to passive optical components L) in a rather simple and very fast way. The overall manufacturing process is very fast and precise. Due to the wafer-scale manufacturing, only a very small number of production steps is required for manufacturing a multitude of modules 1.

Figure 5:
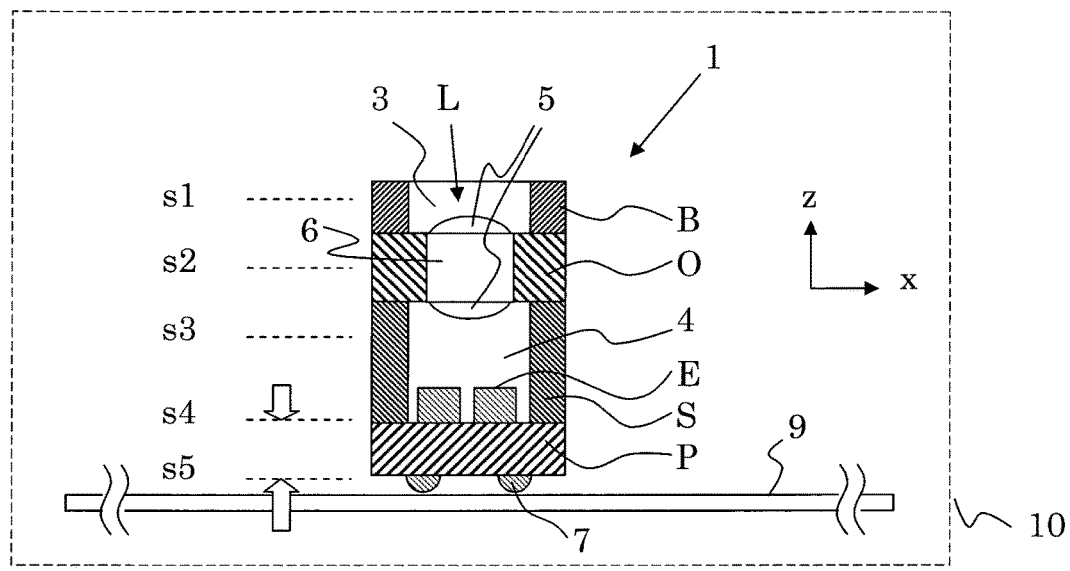
FIG. 5 a cross-sectional view of an opto-electronic module.
Figure 6:
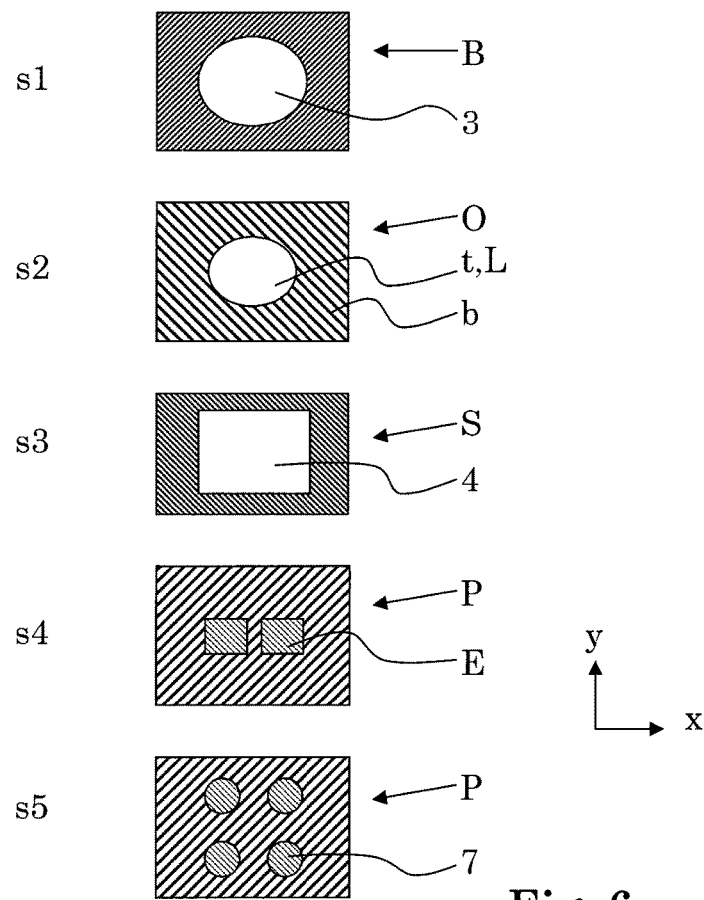
FIG. 6 various cross-sectional views of constituents of the module of FIG. 5.

FIGS. 5 and 6 show, in the same manner as FIGS. 1 and 2, respectively, an opto-electronic module 1. In this case, passive optical components are not separately provided for detecting member D and for emission member E. Light from outside module 1 impinging on detecting member D and light emitted by emission member E exiting module 1 passes through the same optical structures 5, e.g., lens elements. Some other components of module 1, accordingly, are construed somewhat different from those in FIG. 2. In particular, in contrast to the embodiment of FIG. 2, no element separating emission member E from detecting member D is comprised in module 1, unlike in case of the embodiment of FIG. 1, in which a portion of spacer member S contributes to creating two separate compartments, one containing detection member D, the other one containing emission member E.

Figure 7:
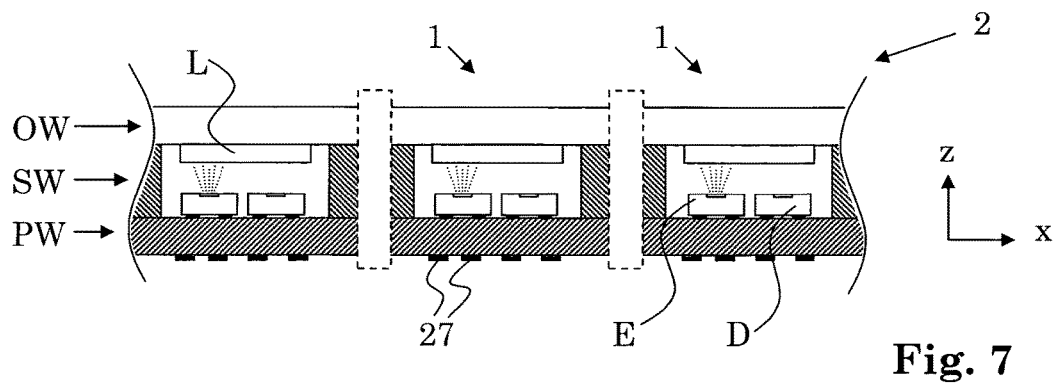
FIG. 7 a cross-sectional view of a wafer stack illustrating the manufacture of opto-electronic modules.

FIG. 7 schematically illustrates the manufacture of other opto-electronic modules 1 and shows a wafer stack 2, the thin dashed rectangles indicating where separation takes place. A transparent optics wafer OW is provided, and the passive optical components L are only very schematically sketched. They are located on the inside of the modules 1. E.g., the passive optical components L, e.g., lenses or lens elements, could be produced on a glass or transparent polymer plate, e.g., by replication, e.g., using embossing. Such an optics wafer OW may be looked upon as a transparent portion with no blocking portion.

A non-transparent spacer wafer SW, e.g., manufactured using replication, e.g., using embossing, and a transparent substrate wafer PW, e.g., a glass plate or a polymer-based plate, are provided. Before wafer stack 2 is formed of wafers OW, SW, PW, active optical components E and D such as LEDs and photo diodes are (mechanically) attached, usually by bonding, e.g., by gluing, soldering or wire bonding. Attaching the active optical components D, E is certainly carried out before separating wafer stack 2 into individual opto-electronic modules 1, i.e. is carried out on wafer level, because this way, the handling is simplified, and a high (lateral) alignment precision can be achieved relatively easily.

Electrical contacts of the opto-electronic modules 1 are formed, e.g., by contact pads 27, or could be formed by a lead frame or by solder balls or provided differently.

It would also be possible to provide that optics wafer OW is partially non-transparent, e.g., like shown in FIGS. 1 through 4.

A partially non-transparent substrate wafer PW could be provided, e.g., based on what has been described above as semi-finished part. Alternatively, a partially non-transparent substrate wafer PW could be provided similar to what has been described before as precursor wafer. But substrate wafer P will usually be (completely) non-transparent, as illustrated in FIG. 7.

In particular if at least one of substrate wafer PW and optics wafer OW is partially transparent and partially non-transparent, spacer wafer SW could be replaced by one of these, by combining the functionalities of the respective two wafers (OW and SW, or PW and SW) in one wafer.

When substrate wafer PW is non-transparent or partially transparent and partially non-transparent, and optics wafer OW, is partially transparent and partially non-transparent, and with spacer wafer SW, if present, non-transparent, opto-electronic modules 1 can be manufactured from which light is emitted only in desired, well-defined ways, more particularly only through desired transparent parts such as through the passive optical components L, and wherein only such light impinges on detecting member D (or, more precisely, on an optically active surface of detecting member D) which has travelled along well-defined ways, more particularly only through desired transparent parts such as through the passive optical components L.

Of course, instead of providing one passive optical component L for all active optical components (D, E) in a module 1, like illustrated in FIG. 7, it is also possible to provide separate ones for separate active optical components.

Figure 8:
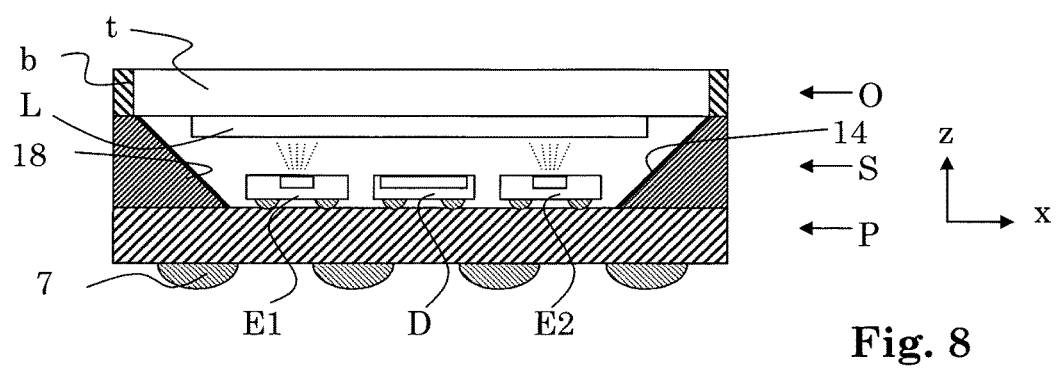
FIG. 8 a cross-sectional view of an opto-electronic module.

FIG. 8 schematically illustrates a cross-sectional view of another opto-electronic module 1. Like also the further modules 1 illustrated in FIGS. 9 to 12 and 17, this opto-electronic module 1 can be manufactured in a way described above. Module 1 comprises an optics member O comprising transparent portions t and blocking (non-transparent) portions b, a spacer member S and a substrate member P on which two emission members E1, E2 and a detecting member D are mounted, and to which solder balls 7 are applied. A single passive optical component L is provided in conjunction with all active optical components E1, E2, D. Spacer member 14 may have slanted side walls which may be coated, e.g., with a reflective coating 18.

Figure 9:
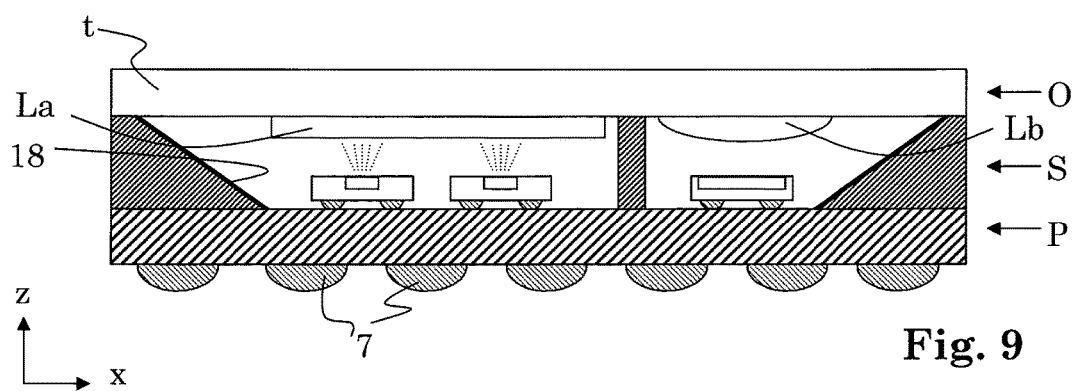
FIG. 9 a cross-sectional view of an opto-electronic module.

FIG. 9 schematically illustrates a cross-sectional view of another opto-electronic module 1. This module 1 is in several aspects similar to the one illustrated in FIG. 8. But no blocking portions are provided, but it would be possible to do so, and, similar to the embodiment illustrated in FIGS. 1 to 4, detection member(s) D and emission members E are separated from each other by a portion of spacer member S, and separate passive optical components La, Lb, e.g., lenses, are provided.

Whereas in FIGS. 7 to 9, the active optical components are illustrated like being electrically connected to substrate member S by solder balls. But, as mentioned before, other ways of providing mechanical and/or electrical connections could be provided.

Figure 10:
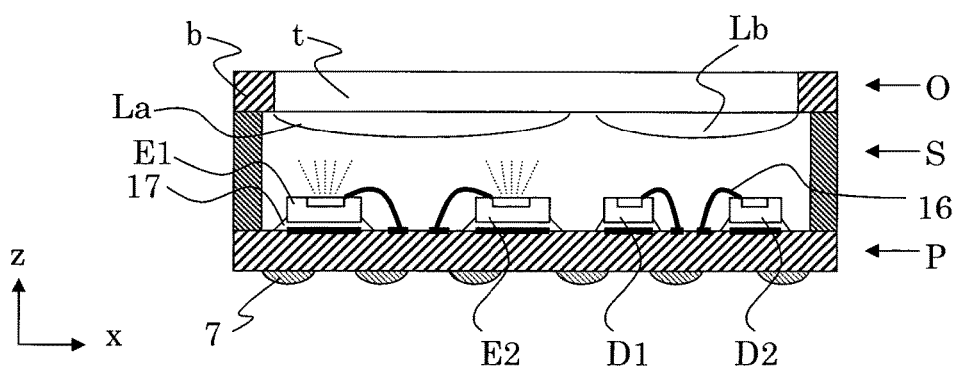
FIG. 10 a cross-sectional view of an opto-electronic module.

FIG. 10 illustrates a similar opto-electronic module 1 as FIG. 8, but here, separate passive optical components La, Lb are provided for emission members E1, E2 and detection members D1, D2. It would also be possible to provide a different number of passive optical components and assign these to the active optical components, e.g., to provide, like in FIG. 8, one passive optical component for all active optical components, or to provide one passive optical component for each of the active optical components.

Furthermore, in FIG. 10, another way of electrically contacting bare-die active optical components is illustrated, namely using wirebonding (wirebond 16) and electrically conductive glue 17. One can, e.g., and as shown in FIG. 10, electrically contact the front side of the active optical components (emission members E1, E2, and detecting members D1, D2 by means of wire bond 16 while electrically contacting the back side by means of electrically conductive glue 17. Both contacts may be directed to contact pads of the PCB or interposer which makes up for the substrate member P. Of course, other ways of electrically contacting the active optical components are possible, too.

Including an unpacked (bare die) active optical component in a module 1 can allow to realize particularly small modules 1.

Figure 11:
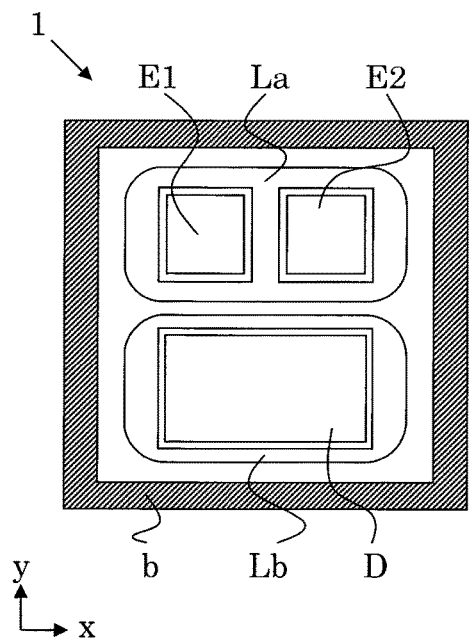
FIG. 11 a top view onto an opto-electronic module.
Figure 12:
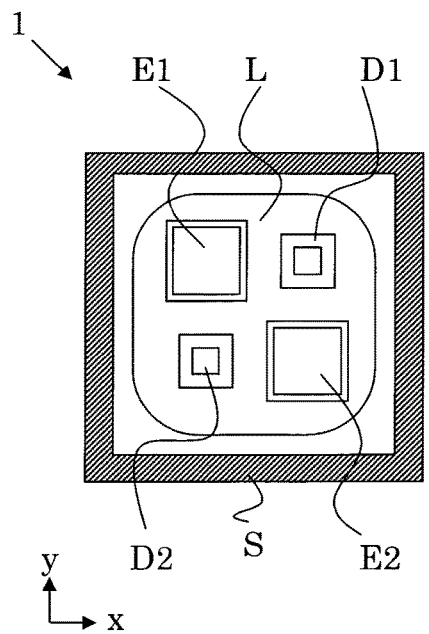
FIG. 12 a top view onto an opto-electronic module.

Although the active optical components are, in most of the schematical illustrations, drawn like being situated side-by-side, it can, in case three or more active optical components are present in a module, rather be provided to arrange them differently, e.g., like illustrated in FIGS. 11 and 12.

FIGS. 11 and 12 show schematic top views onto opto-electronic modules 1 in order to visualize various possibilities of arranging passive optical components and active optical components in a module 1. The inner rectangles of the active optical components (D, D1, D2, E1, E2) represent the optically active surfaces of the respective active optical component. Depending on the presence or not-presence of one or more blocking portions b and of a baffle member, the housing portion visible in the top views can be provided by the one or more blocking portions b, e.g., as shown in FIG. 11, by the baffle member (not shown), or by spacer member S, e.g., as shown in FIG. 12.

Emission members (E1, E2) can be, e.g., LEDs (light emitting diodes). They can be high-intensity short-pulse light emitters such as LEDs used in today's photo cameras or smart phones.

Detecting members D, D1, D2 can be, e.g., photo diodes, like illustrated in FIG. 12, or pixel arrays (image sensors), like illustrated in FIG. 11, or others.

FIGS. 13 to 16 relate to opto-electronic modules comprising a light guide element.

Figure 13:
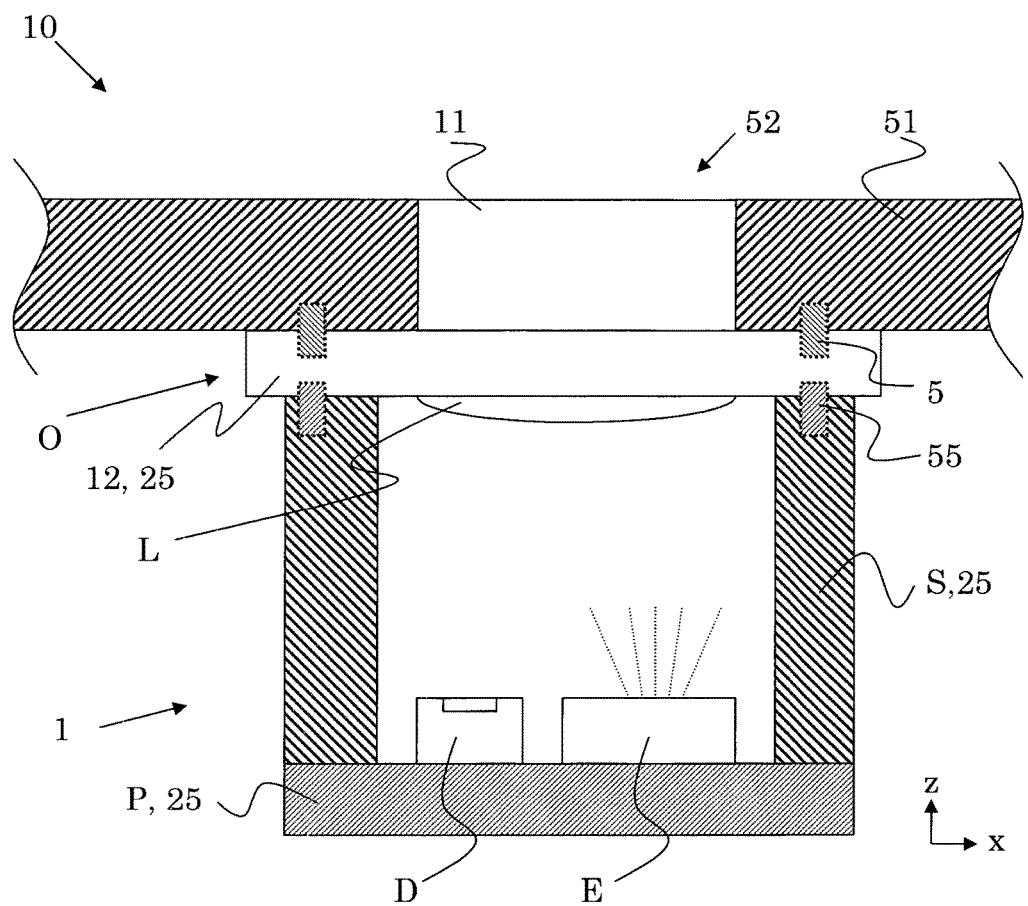
FIG. 13 a cross-sectional view of a detail of an electronic device comprising an opto-electronic module comprising a light guide element.

FIG. 13 shows a schematic cross-sectional view of a detail of an electronic device 10 comprising an opto-electronic module 1 comprising an optics member O comprising a light guide element 11. Electronic device 10 comprises a housing 51 in which an opening 52 is provided, e.g., in form of a through-hole, e.g., of circular cross-section. Optical system 1 comprises said light guiding element 11, a base plate 12 and at least one passive optical component L, in particular at least one lens element, wherein in the embodiment of FIG. 13, only one passive optical component is present, but along the lines of the teachings above, it is clear that two, three or more passive optical components can be provided, depending on the purpose for which the opto-electronic module 1 is designed. Light guiding element 11 and base plate 12 may be distinct parts or form a unitary part. Light guiding element 11, or at least a portion thereof, is arranged in opening 52. Its shape is designed to complement the shape of opening 52.

Opto-electronic module 1 further comprises two, or, more generally at least two, active optical components D, E, namely a detecting member D and an emission member E, such as, e.g., an LED and a photo diode or some other active optical components described in the present patent application, and a casing portion 25 holding the active optical components D, E. Casing portion 25 can be a unitary part or may comprise two or more parts, in particular, as shown in FIG. 13, a spacer member S and a substrate member P, wherein these can be construed and manufactured like described in other embodiments described in the present patent application. Casing portion 25 ensures a precise and constant relative positioning of active optical components D, E with respect to optics member O (both, laterally and vertically), in particular to the passive optical component(s). The vertical direction is designated z in FIG. 13 and is the direction perpendicular to base plate 12, and lateral directions x, y are the directions in the plane defined by base plate 12.

Casing portion 25 is laterally positioned relative to opticals member O by means of mechanical guiding elements 55 of which at least one, usually two or even three or four are provided. Each of these mechanical guiding elements 55 cooperates with a mechanical guiding element at the respective other part, e.g., a guiding pin of casing portion 25 interacts with a hole in base plate 12, or vice versa. The vertical alignment is mainly ensured by a vertical extension of casing portion 25 (in particular of spacer member S), with active optical components D, E attached thereto (in particular to substrate member P) in a well-defined and precise vertical position. The lateral position of active optical components D, E in casing portion 25 of course has to be well-defined and precise, too. It is, however, possible to attach optics member O to casing portion 25 in a different manner, e.g., like described in other embodiments described in the present patent application, e.g., by bonding, gluing, wherein lateral alignment of active optical components D, E in casing portion 25 and on substrate member P, respectively, can be accomplished, e.g., on wafer-level or by pick-and-place, using alignment marks.

Base plate 12 comprises two mechanical guiding elements 5, such as alignment pins, cooperating with mechanical guiding elements of housing 51, such as holes, wherein it is also possible to provide only one mechanical guiding element, in particular because also light guiding element 11 can also function as a mechanical guiding element and/or because guiding element 5 can be designed to provide protection against rotation of optics member O with respect to housing 51 when cooperating with the mechanical guiding elements of housing 51, e.g., by providing rectangular or triangular or star-shaped lateral cross-sections. It is also possible to produce holes in base plates 12 as mechanical guiding elements 5 which cooperate with pins of housing 51.

Mechanical guiding elements 5 and 55 or some of them, can, in addition, also be provided for fixing optics member O to housing 51 and to casing portion 25, respectively, e.g., by providing threads or windings or a snap fit. But it is also possible to provide that the actual fixing is, at least in part, provided differently, e.g., by bonding, such as by applying an epoxy glue and hardening the glue, e.g., by curing such as by radiation curing or thermal curing, cf. also the description above.

Usually, light guiding element 11 describes an axis, e.g., a central axis. This axis is usually vertically aligned.

A light path of light to or from the active optical components D, E usually runs through at least one of the passive optical components L, through base plate 12 and through light guiding element 11.

Base plate 12 may be made substantially of a transparent material such as a transparent polymer or glass. In that case, it can be useful to provide at least its side walls (which have laterally aligned surface normals) with a coating, in particular with a non-transparent coating. But it is also possible to provide that base plate 12 has at least one transparent portion and at least one non-transparent portion (not shown in FIG. 13), e.g., the non-transparent portion being substantially made of a non-transparent material, e.g., like described in the embodiments of FIGS. 1-6, 8, and 10.

Passive optical component L can be, e.g., a diffractive or a refractive lens, or a refractive and diffractive lens, or may comprise two or more lens elements. It may also make use of total internal reflection (TIR).

Electronic device 10 can be, e.g., a photographic device or a hand-held communication device such as a mobile phone, in particular a smart phone. In particular in the latter, space is very scarce such that opto-electronic modules 1 arranged therein have to be as small as possible.

Typical dimensions of base plates 12 are laterally below 10 mm, in particular below 7 mm, and vertically below 0.6 mm, in particular below 0.4 mm. Typical dimensions of light guiding elements 11 are laterally below 5 mm, in particular below 3.5 mm, and vertically below 3 mm, in particular below 2 mm. Typical dimensions of lenses as passive optical components L are laterally below 10 mm, in particular below 6 mm and vertically below 3.5 mm, in particular below 1 mm.

Figure 14:
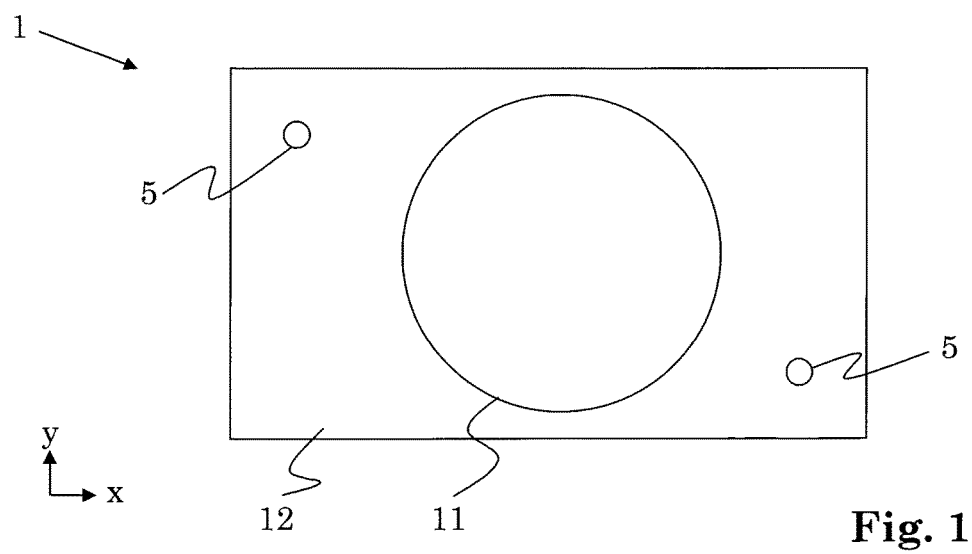
FIG. 14 a top view of the optics member illustrated in FIG. 13.

FIG. 14 is a top-view onto the optics member illustrated in FIG. 13.

Figure 15:
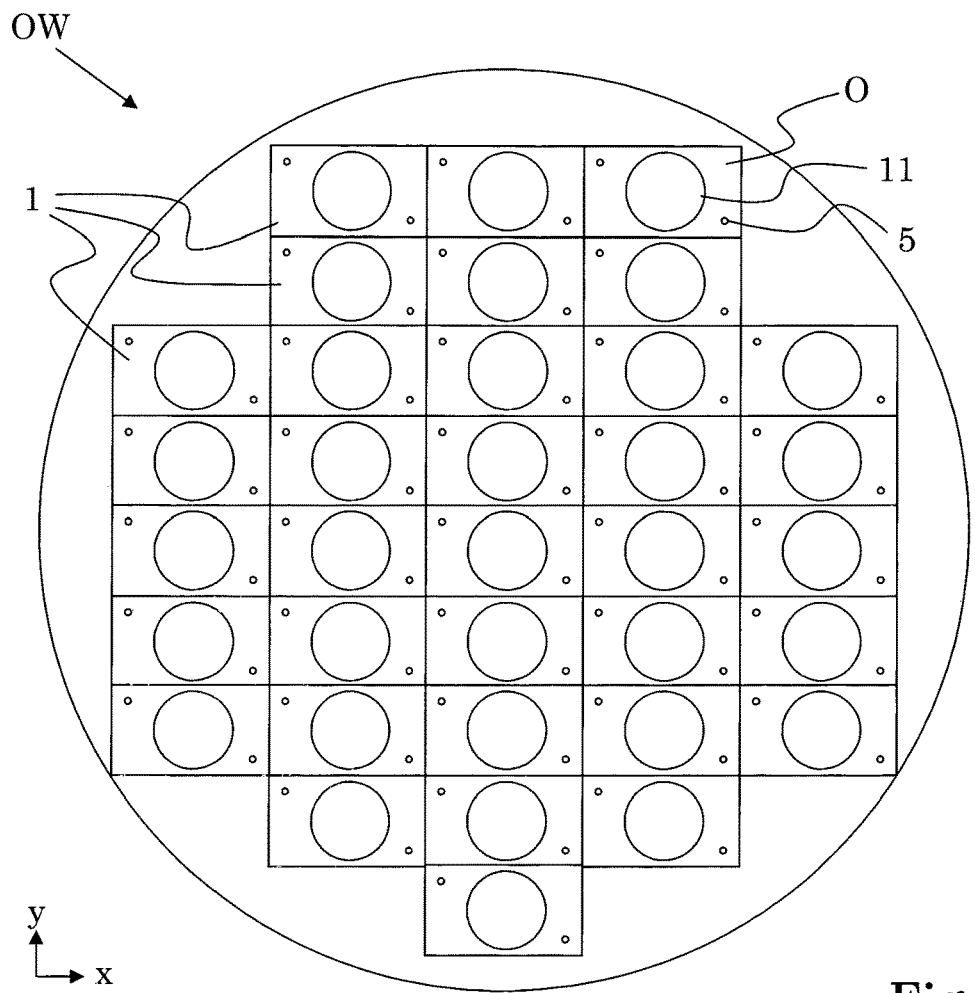
FIG. 15 a top view of an optics wafer of optics members shown in FIG. 13.

FIG. 15 is a schematic top view of an optics wafer 30 of optics members O as shown in FIG. 13. The straight lines show where separation will take place. A mass production of such optics members O is possible using a wafer-scale production method. High alignment precision and high-yield high-productivity manufacturing can be accomplished this way.

Figure 16:
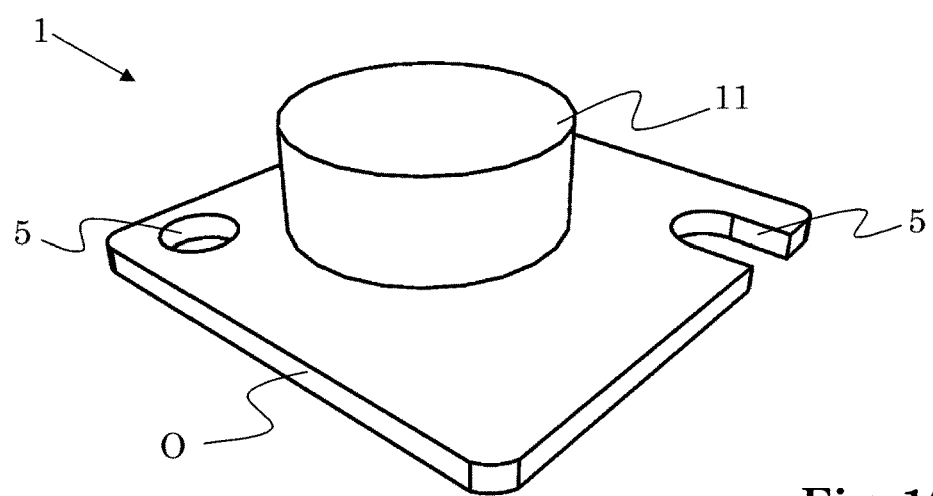
FIG. 16 a perspective view of an optics member comprising a light guide element.

FIG. 16 is a perspective view of a similar optics member as the one shown in FIGS. 13 and 14. The rounded corners of the of the base plate 12 shown in FIG. 16 can readily be produced using, e.g., laser cutting or ultrasonic cutting.

Further details concerning opto-electronic modules and electronic devices discussed in conjunction with FIGS. 13 to 16 and in particular to the manufacture thereof, can be found in the US provisional application with Ser. No. 61/543,490 filed on Oct. 5, 2011 having the title "MICRO-OPTICAL SYSTEM AND METHOD OF MANUFACTURE THEREOF" is therefore s herewith incorporated by reference in the present patent application.

Whereas above, it has been mentioned and explained that—using at least two emission members—it is possible to adjust the color or hue of the light emitted by the opto-electronic module, it shall be explained below, referring to FIG. 17, that it is also possible to effect that different light intensity distributions are (selectably) emitted from the opto-electronic module.

Figure 17:
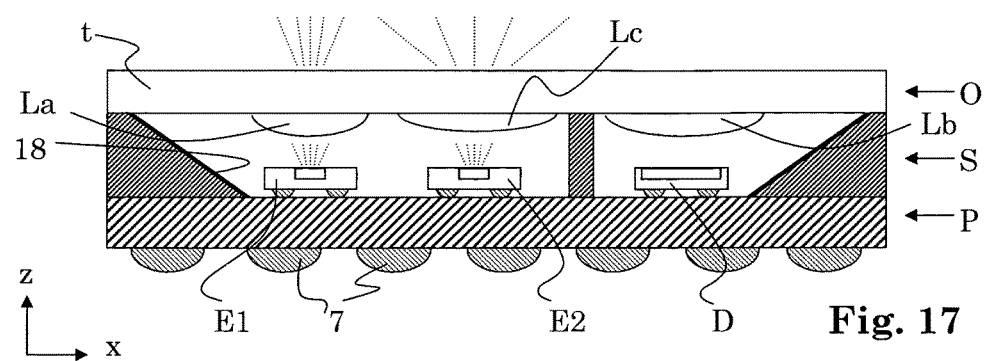
FIG. 17 a cross-sectional view of an opto-electronic module.

FIG. 17 is a schematical cross-sectional view of another opto-electronic module 1. This opto-electronic module is to a large extent similar to the one of FIG. 9, thus it is referred to FIG. 9 for details. However, in FIG. 17, the two emission members E1, E2 emit light through different passive optical components La and Lc, respectively. Passive optical components La, Lc are structured differently, such that an angular distribution of light intensity of the light emitted from light member E1 is different from an angular distribution of light intensity of the light emitted from light member E2, as is also symbolized in FIG. 17, cf. the dashed lines above transparent portion t. Using, e.g., a controller or processing unit, such as one mentioned further above, the emission members E1, E2 may be controlled so as to emit light of different intensity; note that the controller or processing unit not necessarily needs to be operationally connected to detecting member D for accomplishing this. When used for image capturing, an intensity ratio of light emitted from the emission members E1, E2 may be chosen in dependence of a focus length of an imaging lens used and/or in dependence of a light distribution present in the scene to be captured, wherein the latter may be determined by detecting member D.

Bare die emission members or emission members in very small-sized packages (such as chip-scale packages) make possible the design of particularly compact opto-electronic modules. However, if emission members E1, E2 have, by themselves, already different light intensity distributions, e.g., because one or more of them is packaged to comprise a passive optical component such as a lens or an aperture or a reflector, the provision of different lenses La, Lc is optional. And yet another way of producing light of variable intensity distribution is to select different (usually vertical) distances between the emission members E1, E2 (more particularly their respective optically active surfaces) and the respective associated passive optical component(s). In this case, it is not necessary to use separate or different passive optical components for the emission members E1, E2, but one and the same or two identically structured ones may be used. The described ways of selectively changing the angular and/or spatial distribution of light emitted from the opto-electronic module may, of course, be combined, e.g., pair-wise or all of them. And, of course, the principles of achieving selectable light intensity distribution (and also the principles of achieving selectable light color) is not bound to the embodiment illustrated in the respective figure referring to which they have been explained, but may be implemented in other opto-electronic module configurations as well, such as those deducable from other described embodiments.

For any herein disclosed embodiment, the emission member(s) usually emit visible light. However, it can also be useful, in particular in low-light situations, to provide that one or more emission member emits infrared light. And while light burst (flash) emission, i.e. emission of (short and intense) light pulses, can be valuable in many cases, in particular in still photography or—creating a series of pulses—in video, in some cases, emission of continuous light can be useful, too, e.g., in (movie, video) filming. Furthermore, the emission member(s) can be designed for the respective purpose(s) and/or can be controlled accordingly, e.g., by the above-mentioned controller or processing unit.

The opto-electronic modules described in the present patent application can be very small and can be produced in high volumes and in high quality, in particular as far as alignment precision, laterally as well as laterally, is concerned.

As has been mentioned before, flash light modules having a light sensing capability, more particularly a color sensing capability, can be provided by the invention, in particular very small modules of that kind. When used in conjunction with image recording such as taking photos or making videos, using modules comprising at least two emitting members can make possible to achieve an adapted and/or an improved, in particular a more natural illumination of a scene to be recorded, wherein in that case, the color or the spectral composition of light emitted by the at least two emitting members is partially or substantially different for at least some of the emitting members, and the color or spectral composition is in particular selected in dependence of a signal or signals produced by said at least one detection member, e.g., by controlling an emission of light from said at least two emission members so as to provide a selected (desired) intensity ratio (depending on said signal or signals).

The invention claimed is:

1. An opto-electronic module comprising:
    a substrate member;
    at least two emission members mounted on said substrate member;
    at least one detecting member mounted on said substrate member;
    an optics member comprising a first lens and a second lens; and
    a spacer member arranged between said substrate member and said optics member, the spacer member abutting a first side of the substrate member and a first side of the optics member, and establishing a well-defined distance between the substrate member and the optics member, wherein the first side of the substrate member faces the first side of the optics member;
    wherein the first lens is assigned to a first of said at least two emission members and the second lens is assigned to a second of said at least two emission members, said first lens and said first emission member being arranged such that light emitted from said first emission member traverses predominantly said first lens, and said second lens and said second emission member being arranged such that light emitted from said second emission member traverses predominantly said second lens, wherein a light intensity distribution of light emitted by said first emission member through said first lens leaving the opto-electronic module is different from a light intensity distribution of light emitted by said second emission member through said second lens leaving the opto-electronic module.

2. The module of claim 1 wherein the at least two emission members are nominally different with respect to their respective specifications.

3. The module according to claim 2, wherein at least two of said emission members have spectrally different light emission characteristics.

4. The module according to claim 3, wherein a first one of the at least two emission members is structured and configured for emitting light comprising at least one of:
    a higher portion of light of the blue spectral range than a second one of the at least two emission members; or
    a smaller portion of light of the yellow spectral range than a second one of the at least two emission members.

5. The module according to claim 3, wherein at least a first and a second of said at least two emission members have different spectral emission characteristics for creating or mimicing an emission of white light of varying color temperature by varying a relative emission intensity of these two emission members.

6. The module according to claim 3, wherein the first one of the emission members emits substantially white light of a lower color temperature than the second one.

7. The module according to claim 3, comprising three or four or five emission members, a portion of them or all of them emitting light of a different spectral composition.

8. The module according to claim 2, wherein said substrate member is a printed circuit board.

9. The module according to claim 2, wherein said at least one detecting member is color-sensitive.

10. The module according to claim 2, wherein the at least two emission members are flash light sources.

11. An appliance comprising a multitude of modules according to claim 2, the appliance further comprising a substrate wafer, an optics wafer, and a spacer wafer, wherein the substrate members for the multitude of modules are comprised in said substrate wafer, the optics members for the multitude of modules are comprised in said optics wafer, and the spacer members for the multitude of modules are comprised in said spacer wafer.

12. An electronic device comprising at least one opto-electronic module according to claim 2 and a processing unit operationally connected to said at least two emission members and to said at least one detecting member.

13. The electronic device according to claim 12, wherein said processing unit is structured and configured for receiving signals from said detecting member and for controlling said emission member in dependence of said signals.

14. The module according to claim 1, wherein the light intensity distribution is an angular light intensity distribution.

15. The module according to claim 1, wherein said optics member comprises at least one non-transparent portion, and transparent portions comprising, respectively, said first and second lenses.

16. The module according to claim 1, wherein said substrate member is a printed circuit board.

17. The module according to claim 1, wherein the at least two emission members are flash light sources.

18. An appliance comprising a multitude of modules according to claim 1, the appliance comprising a substrate wafer, an optics wafer, a spacer wafer, wherein the substrate members for the multitude of modules are comprised in said substrate wafer, the optics members for the multitude of modules are comprised in said optics wafer, and the spacer members for the multitude of modules are comprised in said spacer wafer.

19. An electronic device comprising at least one opto-electronic module according to claim 1 and a processing unit operationally connected to said at least two emission members and to said at least one detecting member.

20. The module according to claim 1 wherein a spatial or angular light intensity distribution of light emitted by said first emission member through said first lens leaving the opto-electronic module is different from a spatial or angular light intensity distribution of light emitted by said second emission member through said second lens leaving the opto-electronic module.

* * * * *